(12) United States Patent
Nitta et al.

(10) Patent No.: US 8,080,449 B2
(45) Date of Patent: Dec. 20, 2011

(54) METHOD FOR MANUFACTURING THIN-FILM TRANSISTORS

(75) Inventors: Hidekazu Nitta, Chiba (JP); Hidekazu Miyake, Mobara (JP); Takuo Kaitoh, Mobara (JP); Daisuke Sonoda, Chiba (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 0 days.

(21) Appl. No.: 12/755,584

(22) Filed: Apr. 7, 2010

(65) Prior Publication Data
US 2010/0255643 A1   Oct. 7, 2010

(30) Foreign Application Priority Data

Apr. 7, 2009  (JP) .................. 2009-092938
Apr. 7, 2009  (JP) .................. 2009-092939

(51) Int. Cl.
*H01L 21/00* (2006.01)
(52) U.S. Cl. ............... 438/143; 438/158; 257/E21.318; 257/E21.414

(58) Field of Classification Search .............. 438/143, 438/158; 257/E21.318, E21.414
See application file for complete search history.

(56) References Cited

U.S. PATENT DOCUMENTS

| | | | | |
|---|---|---|---|---|
| 5,627,089 A | * | 5/1997 | Kim et al. | 438/158 |
| 2002/0009836 A1 | * | 1/2002 | Takechi | 438/151 |
| 2003/0207503 A1 | * | 11/2003 | Yamazaki et al. | 438/149 |
| 2009/0152635 A1 | * | 6/2009 | Jeong et al. | 257/368 |

FOREIGN PATENT DOCUMENTS

JP   11-87721   3/1999

\* cited by examiner

*Primary Examiner* — Alexander Ghyka
*Assistant Examiner* — Stanetta Isaac
(74) *Attorney, Agent, or Firm* — Antonelli, Terry, Stout & Kraus, LLP.

(57) ABSTRACT

Gate electrodes are formed on a substrate. A gate insulation film is formed so as to cover the gate electrodes. A semiconductor layer is formed in regions on the gate insulation film in a region which overlap with at least the gate electrodes. Plasma treatment is applied to the semiconductor layer using a gas which contains a dopant thus increasing impurity concentration of a surface layer of the semiconductor layer. A conductive film is formed on the surface layer of the semiconductor layer to which the plasma treatment is applied. A source electrode and a drain electrode are formed by etching the conductive film.

7 Claims, 7 Drawing Sheets

METHOD FOR MANUFACTURING THIN-FILM TRANSISTORS

CROSS-REFERENCE TO RELATED APPLICATION

The present application claims priority from Japanese applications JP2009-092938 filed on Apr. 7, 2009 and JP2009-092939 filed on Apr. 7, 2009, the contents of which are hereby incorporated by reference into this application.

BACKGROUND OF THE INVENTION

1. Field of the Invention

The present invention relates to a method for manufacturing thin film transistors.

2. Description of the Related Art

With respect to a thin film transistor, there has been known a technique where a contact resistance is lowered by interposing a silicon layer of high impurity concentration between a silicon layer and a source electrode or a drain electrode (see JP-A-11-87721).

In the conventional thin film transistor, a silicon layer which constitutes a channel and a silicon layer of high impurity concentration which constitutes a source electrode and a drain electrode are formed and hence, it is necessary to form them by etching respectively. Further, the silicon layer of high impurity concentration per se has the resistance and hence, it is desirable to form such a silicon layer with a small thickness. To prevent an erroneous operation due to absorption of light, it is preferable to form silicon layers in two layers such that these layers have a small thickness respectively. However, in forming the source electrode and the drain electrode, the silicon layer which constitutes the channel is also etched so that the reduction of thicknesses of these layers is limited.

SUMMARY OF THE INVENTION

It is an object of the present invention to reduce a thickness of a semiconductor layer while simplifying an etching process.

(1) A method for manufacturing thin film transistors according to the present invention includes the steps of: forming gate electrodes; forming a gate insulation film so as to cover the gate electrodes; forming a semiconductor layer in regions on the gate insulation film which overlap with at least the gate electrodes; increasing impurity concentration of surface layers of the semiconductor layers by applying plasma treatment to the semiconductor layers using a gas which contains a dopant; forming a conductive film on the surface layers of the semiconductor layers to which the plasma treatment is applied; and forming source electrodes and drain electrodes by etching the conductive film. According to the present invention, instead of further forming a semiconductor layer on a semiconductor layer, the impurity concentration of the surface layer of the semiconductor layer is increased and hence, neither the formation of semiconductor layers in two layers nor the etching of semiconductor layers in two layers is performed. Accordingly, it is possible to reduce a total thickness of the semiconductor layer while simplifying an etching process.

(2) In the method for manufacturing thin film transistors having the constitution (1), the step of forming the semiconductor layer may include patterning of the semiconductor layer, and the plasma treatment maybe applied to the semiconductor layer to which the patterning is applied thus increasing the impurity concentration of the surface layer also on side surfaces of the semiconductor layer raised from the gate insulation film.

(3) In the method for manufacturing thin film transistors having the constitution (1), the method may further include a step of patterning the semiconductor layer after the plasma treatment is performed, and the step of patterning the semiconductor layer may include etching of the surface layer whose impurity concentration is increased.

(4) In the method for manufacturing thin film transistors having any one of the constitutions (1) to (3), the gas may contain phosphine which is a phosphorus compound as the dopant.

(5) A method for manufacturing thin film transistors according to the present invention includes the steps of: forming gate electrodes; forming a gate insulation film so as to cover the gate electrodes; forming a semiconductor layer in regions on the gate insulation film which overlap with at least the gate electrodes; forming a channel protective film in a third region sandwiched between a first region and a second region of the semiconductor layer; increasing impurity concentration of surface layers of the first region and the second region by applying plasma treatment to the first region, the second region and the channel protective film using a gas which contains a dopant; and forming source electrodes and drain electrodes on the respective surface layers of the first region and the second region to which the plasma treatment is applied. According to the present invention, instead of further forming a semiconductor layer of high impurity concentration on a semiconductor layer which constitutes a channel, the impurity concentration of the surface layer of the semiconductor layer which constitutes the channel is increased and hence, neither the formation of semiconductor layers of high impurity concentration nor the etching of the semiconductor layer is performed. Accordingly, it is possible to reduce a total thickness of the semiconductor layer while simplifying an etching process.

(6) In the method for manufacturing thin film transistors having the constitution (5), the gas may contain phosphine which is a phosphorus compound as the dopant.

(7) In the method for manufacturing thin film transistors having the constitution (6), a surface layer of the channel protective film may be doped with phosphorus by the plasma treatment thus forming a gettering layer which captures contamination substances by a gettering effect.

DESCRIPTION OF THE PREFERRED EMBODIMENTS

Hereinafter, an embodiment of the present invention is explained in conjunction with drawings. FIG. 1 to FIG. 6 are views for explaining a method for manufacturing film transistors according to the embodiment of the present invention.

In this embodiment, thin film transistors (to be more specific, field effect transistors constituted of thin films) are formed on a substrate 10. The substrate 10 may be made of glass or a resin. The substrate 10 possesses the light transmissivity.

Figure 1:
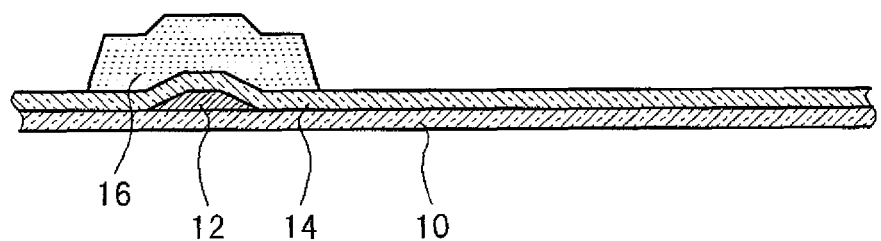
FIG. 1 is a view for explaining a method for manufacturing thin film transistors according to an embodiment of the present invention.

Gate electrodes 12 are formed on the substrate 10 (FIG. 1). The gate electrode 12 is constituted of a single layer made of Al, Cr, Mo, Ta or the like or a stacked layer made of these materials. Further, a gate insulation film 14 is formed so as to cover the gate electrodes 12. The gate insulation film 14 is made of silicon nitride or the like.

A semiconductor layer 16 is formed in regions on the gate insulation film 14 which overlap with at least the gate electrodes 12. The semiconductor layer 16 is made of amorphous silicon, microcrystalline silicon or polycrystalline silicon. PECVD (Plasma Enhanced Chemical Vapor Deposition) or sputtering is applicable to the formation of the semiconductor layers 16. For example, the semiconductor layer 16 made of amorphous silicon can be formed by PECVD using mono-silane ($SiH_4$) as a source gas. A step of forming the semiconductor layer 16 includes patterning of the semiconductor layers 16. Patterning may be performed by etching which uses an etching resist as a mask.

Figure 2:
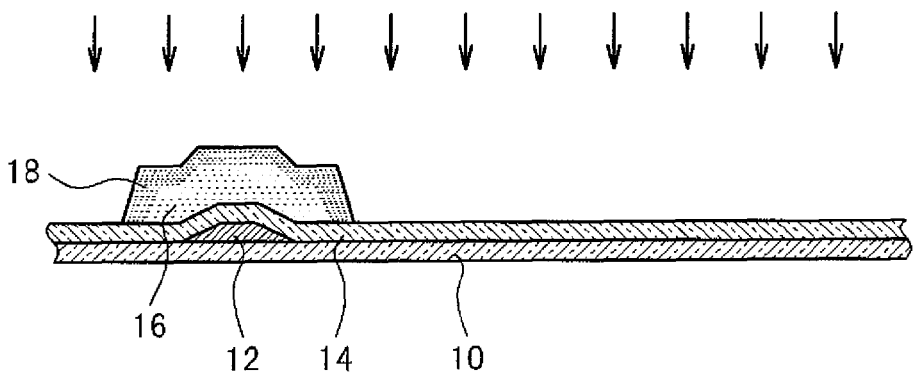
FIG. 2 is a view for explaining the method for manufacturing the thin film transistors according to the embodiment of the present invention.

As shown in FIG. 2, the plasma treatment which uses a gas containing a dopant is applied to the semiconductor layer 16. As the dopant, phosphorus (P) for forming an n-type semiconductor, boron (B) for forming a p-type semiconductor or the like can be named. The gas does not contain raw materials for forming other films such as mono-silane ($SiH_4$). Plasma is generated in an atmosphere into which such a gas is introduced, and a surface layer 18 of the semiconductor layer 16 is exposed to plasma.

Due to the plasma treatment, the impurity concentration of the surface layer 18 of the semiconductor layer 16 can be increased. For example, when a gas containing phosphine ($PH_3$) which is a phosphorus (P) compound is used, the surface layer 18 is formed into an $n^+$ layer, and when the gas containing boron (B) is used, the surface layer 18 is formed into a $p^+$ layer.

By increasing the impurity concentration of the surface layer 18, it is possible to lower the contact resistance of the surface layer 18. Since the surface layer 18 is not a layer which is formed by CVD or the like, a thickness of the surface layer 18 can be made extremely small so that a resistance valve of the surface layer 18 per se can be lowered. Further, the impurity concentration of the surface layer 18 is increased by the plasma treatment and hence, it is possible to form the structure having a concentration gradient with no interface between a high concentration layer and a low concentration layer.

It is possible to increase the impurity concentration of the surface layer 18 by annealing the semiconductor layer 16 after injecting impurities into the semiconductor layer 16. In this case, however, the annealing method is performed at a temperature of approximately 500° C. To the contrary, the plasma treatment can be performed at a low temperature (approximately 300° C.). Further, in a method where the semiconductor layer 16 of high impurity concentration is formed by stacking using a CVD method or the like, it is necessary to use etching in forming the semiconductor layer 16 by patterning. In this embodiment, etching is unnecessary.

In this embodiment, the plasma treatment is applied to the semiconductor layer 16 which is formed by patterning and hence, the impurity concentration of the surface layer 18 is increased also on side surfaces of the semiconductor layer 16 raised from the gate insulation film 14.

Figure 3:
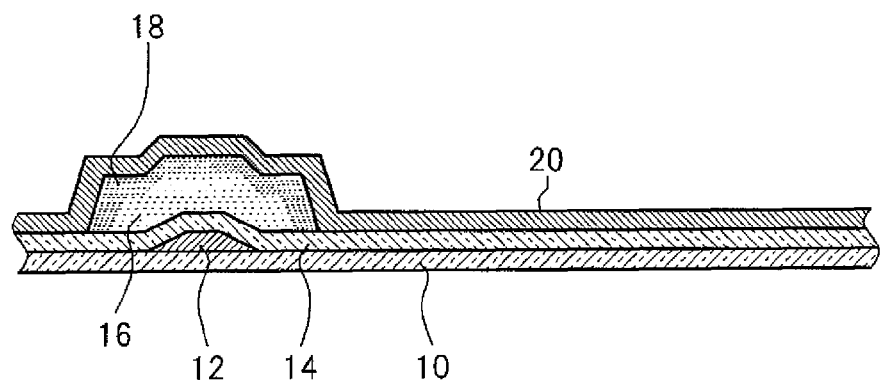
FIG. 3 is a view for explaining the method for manufacturing the thin film transistors according to the embodiment of the present invention.

As shown in FIG. 3, a conductive film 20 is formed on the surface layers 18 of the semiconductor layers 16 to which the plasma treatment is applied. The conductive film 20 is made of Al, for example.

Figure 4:
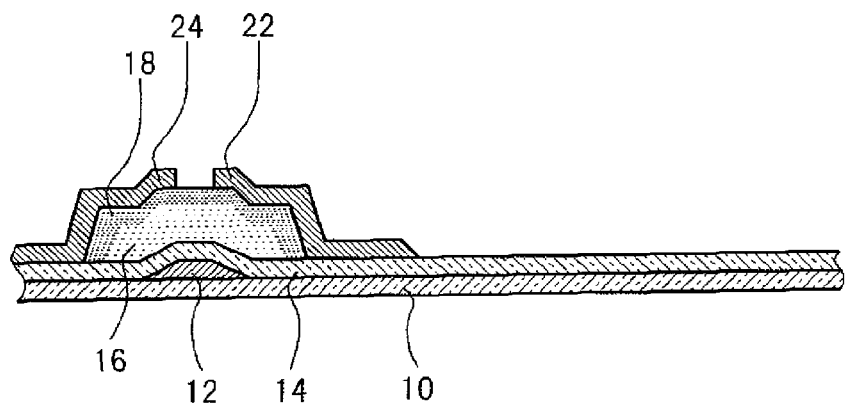
FIG. 4 is a view for explaining the method for manufacturing the thin film transistors according to the embodiment of the present invention.

As shown in FIG. 4, a source electrode 22 and a drain electrode 24 are formed by etching the conductive film 20. The surface layer 18 possesses the high impurity concentration and hence, the contact resistance between the surface layer 18 and the source electrode 22 and the contact resistance between the surface layer 18 and the drain electrode 24 are lowered.

Figure 5:
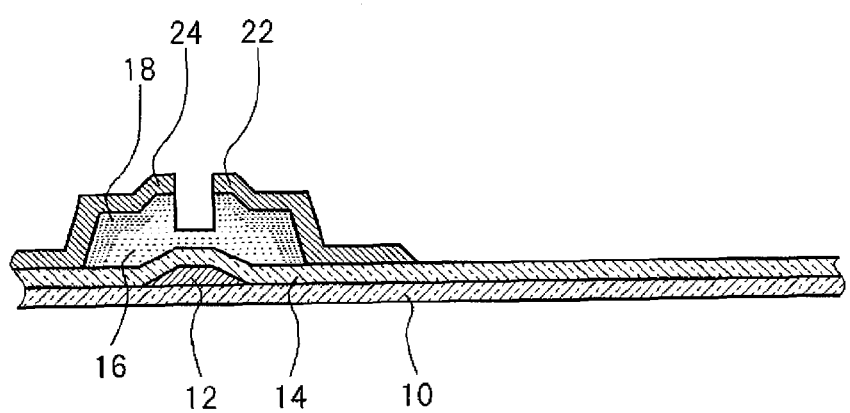
FIG. 5 is a view for explaining the method for manufacturing the thin film transistors according to the embodiment of the present invention.

As shown in FIG. 5, in a region between the source electrode 22 and the drain electrode 24, the surface layer 18 of the semiconductor layer 16 having high impurity concentration (low resistance) is etched. Due to such etching, the electrical conduction between the source electrode 22 and the drain electrode 24 through the surface layer 18 is interrupted. Here, when the surface layer 18 is etched, a portion of the semiconductor layer 16 below the surface layer 18 (inner portion of the semiconductor layer 16) is also etched to some extent. Other remaining processes for forming thin film transistors can be performed using a known method for manufacturing thin film transistors.

According to this embodiment, instead of further forming a semiconductor layer on the semiconductor layer 16, the impurity concentration of the surface layer 18 of the semiconductor layer 16 is increased and hence, it is unnecessary to form the semiconductor layers in two layers, and it is also unnecessary to etch the semiconductor layers in two layers. Accordingly, the etching process can be simplified and, at the same time, a total thickness of the semiconductor layer 16 can be decreased. Further, by making the surface layer 18 thin, a resistance value of the surface layer 18 can be lowered thus enhancing an ON characteristic of a field effect transistor.

In this embodiment, each thin film transistor is formed as a switching element for controlling a pixel of the liquid crystal display panel. Accordingly, processes corresponding to the formation of the thin film transistor as the switching element are further performed.

Figure 6:
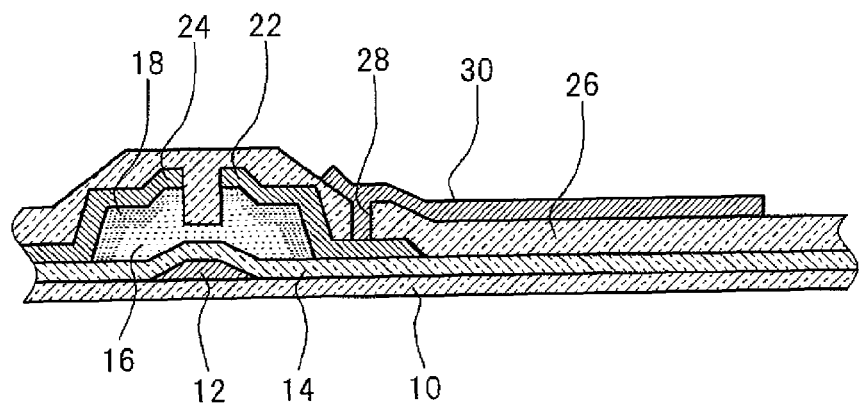
FIG. 6 is a view for explaining the method for manufacturing the thin film transistors according to the embodiment of the present invention.

As shown in FIG. 6, a protective film 26 is formed so as to cover the source electrode 22, the drain electrode 24 and the semiconductor layer 16. Further, a through hole 28 is formed in the protective film 26, and a pixel electrode 30 is formed on the protective film 26 such that the pixel electrode 30 is electrically connected to either one of the source electrode 22 and the drain electrode 24 (in FIG. 6, the source electrode 22). When the pixel electrode 30 is required to possess optical transmissivity, the pixel electrode 30 is made of a transparent conductive material such as ITO (indium tin oxide). When the pixel electrode 30 is not required to possess optical transmissivity, the pixel electrode 30 may be made of a material which exhibits low resistance such as Al. A method for manufacturing the liquid crystal display panel includes known processes.

Figure 7:
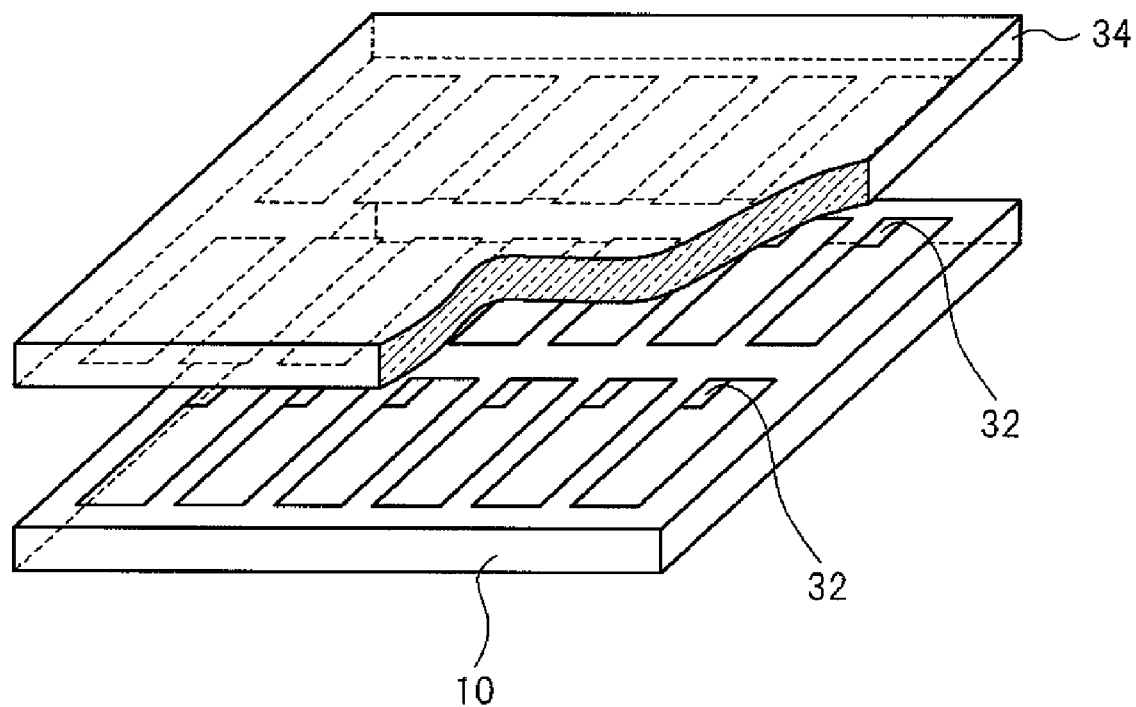
FIG. 7 is a perspective view showing the schematic constitution of a liquid crystal display panel.

FIG. 7 is a perspective view showing the schematic constitution of the liquid crystal display panel. The liquid crystal display panel includes a substrate 10 on which the above-mentioned thin film transistors 32 are formed and a color filter substrate 34, and liquid crystal not shown in the drawing is arranged between both substrates.

[Modification]

Figure 8:
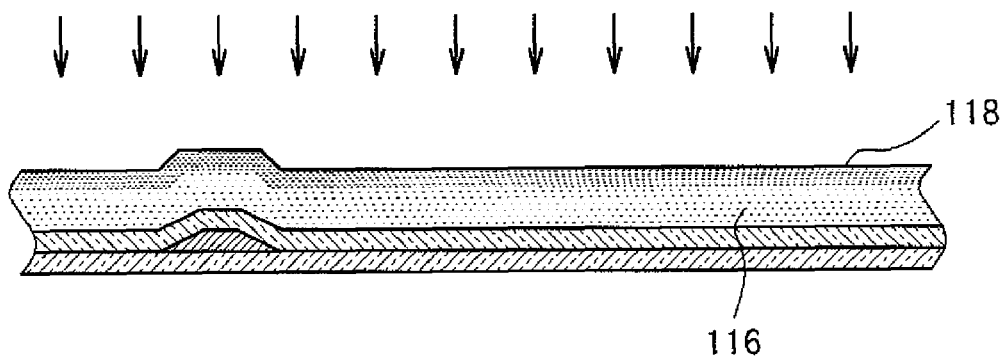
FIG. 8 is a view for explaining a method for manufacturing thin film transistors according to a modification of the embodiment of the present invention.
Figure 9:
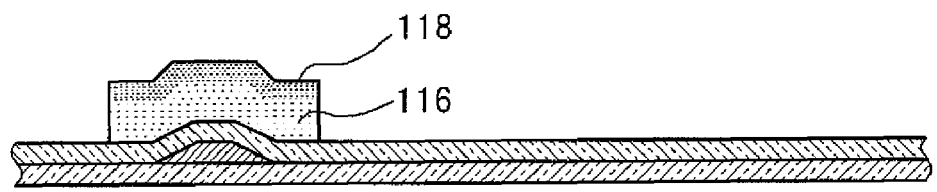
FIG. 9 is a view for explaining a method for manufacturing thin film transistors according to the modification of the embodiment of the present invention.
Figure 10:
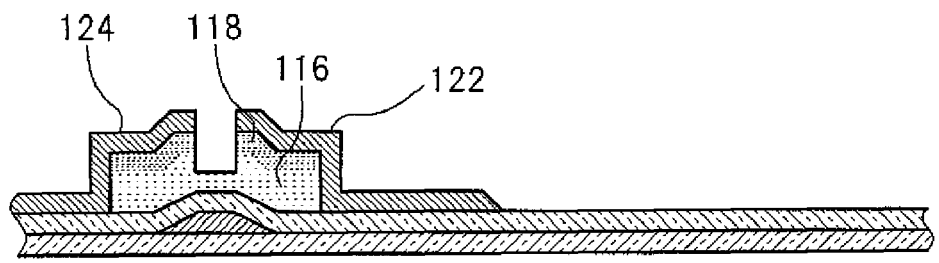
FIG. 10 is a view for explaining a method for manufacturing thin film transistors according to the modification of the embodiment of the present invention.

FIG. 8 to FIG. 10 are views for explaining a method for manufacturing a thin film transistor according to a modification of the embodiment of the present invention.

In this modification, the plasma treatment is applied to a semiconductor layer 116 as shown in FIG. 8 and, thereafter, the semiconductor layer 116 is patterned as shown in FIG. 9. Accordingly, the step of patterning the semiconductor layer 116 includes etching of a surface layer 118 whose impurity concentration is already increased. Further, as shown in FIG. 10, a source electrode 122 and a drain electrode 124 are formed. The detail of the formation of these electrodes is equal to the detail of the corresponding formation of the electrodes explained in conjunction with the above-mentioned embodiment.

In this modification, as shown in FIG. 9, although an upper surface of the patterned semiconductor layer 116 possesses the high impurity concentration, side surfaces of the semiconductor layer 116 remains in a state before the plasma treatment is applied to the semiconductor layer 116. Accordingly, as shown in FIG. 10, although the source electrode 122 and the drain electrode 124 are respectively brought into contact with the surface layer 118 of high impurity concentration (low resistance) on an upper surface of the semiconductor layer 116, the source electrode 122 and the drain electrode 124 are brought into contact with layers having the resistance higher than the resistance of the upper surface on side surfaces of the semiconductor layer 116. Other remaining processes of this modification are substantially equal to the corresponding processes explained in conjunction with the above-mentioned embodiment.

Next, another embodiment of the present invention is explained in conjunction with drawings. FIG. 11 to FIG. 15 are views for explaining a method for manufacturing thin film transistors according to another embodiment of the present invention.

In this embodiment, thin film transistors (to be more specific, a field effect transistors each of which being constituted of thin films) is formed on a substrate 210. The substrate 210 may be made of glass or a resin. The substrate 210 possesses optical transmissivity.

Figure 11:
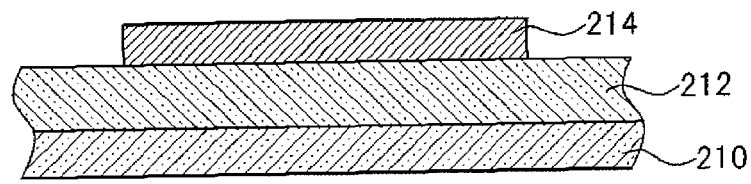
FIG. 11 is a view for explaining a method for manufacturing thin film transistors according to another embodiment of the present invention.

As shown in FIG. 11, a background insulation film 212 is formed on the substrate 210. The background insulation film 212 may be formed by CVD (Chemical Vapor Deposition) or the like using silicon nitride or the like as a material, for example. Gate electrodes 214 are formed on the background insulation film 212. The gate electrode 214 is formed of a single layer made of Al, Cr, Mo, Ta, W or the like or a stacked layer made of these materials.

Figure 12:
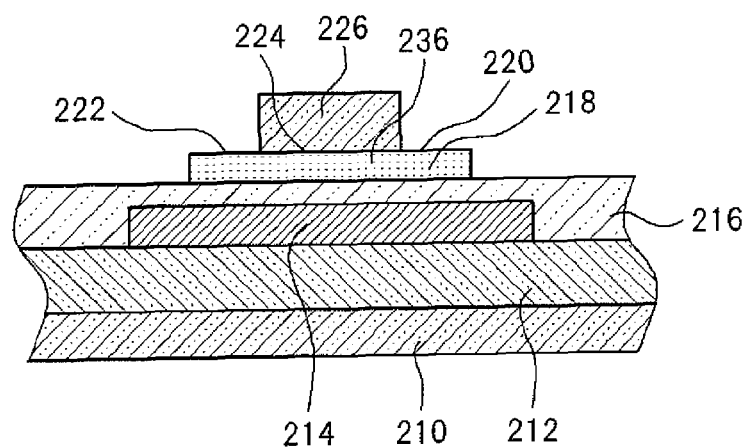
FIG. 12 is a view for explaining a method for manufacturing thin film transistors according to another embodiment of the present invention.

As shown in FIG. 12, a gate insulation film 216 is formed so as to cover the gate electrodes 214. The gate insulation film 216 is made of silicon oxide, silicon nitride or the like.

A semiconductor layer 218 is formed in regions on the gate insulation film 216 which overlap with at least the gate electrodes 214. The semiconductor layer 218 is made of amorphous silicon, microcrystalline silicon or polycrystalline silicon. PECVD (Plasma Enhanced Chemical Vapor Deposition) or sputtering is applicable to the formation of the semiconductor layers 218. For example, the semiconductor layer 218 made of amorphous silicon can be formed by PECVD using mono-silane ($SiH_4$) as a source gas. A step of forming the semiconductor layer 218 includes patterning of the semiconductor layers 218. Patterning may be performed by etching which uses an etching resist as a mask.

By forming the semiconductor layer 218 smaller than the gate electrode 214 (such that a projection surface of the semiconductor layer 218 falls within a projection surface of the gate electrode 214) and by imparting light blocking property to the gate electrode 214, it is possible to block light which intrudes from the substrate 210 by the gate electrode 214. Due to such a constitution, it is possible to prevent the generation of a leak current attributed to light.

Figure 13:
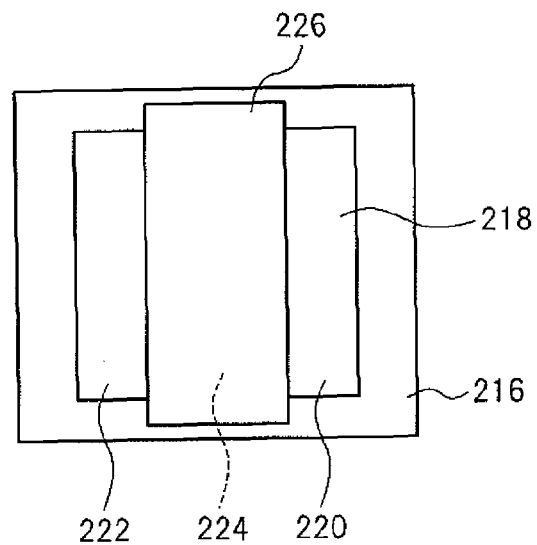
FIG. 13 is a view for explaining a method for manufacturing thin film transistors according to another embodiment of the present invention.

FIG. 13 is a plan view of the structure shown in FIG. 12. The semiconductor layer 218 includes a third region 224 which is sandwiched between a first region 220 and a second region 222. The first region 220 and the second region 222 are separated from each other by the third region 224. A channel protective film 226 is formed on the third region 224. The third region 224 is formed so as to expose the first region 220 and the second region 222. The channel protective film 226 is made of silicon oxide, silicon nitride or the like. The formation of the channel protective film 226 includes the formation of a film using CVD or sputtering, the formation of an etching mask by lithography, and patterning by etching.

Figure 14:
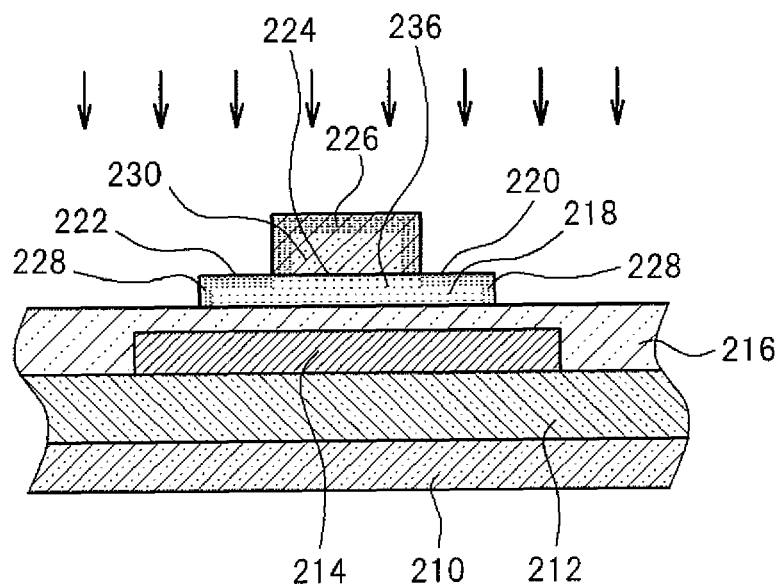
FIG. 14 is a view for explaining a method for manufacturing thin film transistors according to another embodiment of the present invention.

As shown in FIG. 14, the plasma treatment which uses a gas containing a dopant is applied to the first region 220 and the second region 222 of the semiconductor layer 218 and the channel protective film 226. As the dopant, phosphorus (P) for forming an n-type semiconductor, boron (B) for forming a p-type semiconductor or the like can be named. The gas does not contain raw materials for forming other films such as mono-silane ($SiH_4$). Plasma is generated in an atmosphere into which such a gas is introduced, and a surface layer 228 of the first region 220 of the semiconductor layer 218, a surface layer 228 of the second region 222 of the semiconductor layer 218, and a surface layer 230 of the channel protective film 226 are exposed to plasma.

The surface layer 230 of the channel protective film 226 is doped with phosphorus by the plasma treatment thus forming a gettering layer which captures contamination substances (sodium, heavy metal or the like) by a gettering effect.

Due to the plasma treatment, the impurity concentration of the surface layers 228 of the first region 220 and the second region 222 of the semiconductor layer 218 can be increased. For example, when a gas containing phosphine ($PH_3$) which is a phosphorus (P) compound is used, the surface layer 228 is formed into an $n^+$ layer, and when the gas containing boron (B) is used, the surface layer 228 is formed into a $p^+$ layer. By using a gas which contains $H_2$, silicon atoms which constitute the semiconductor layer 218 can be terminated with hydrogen.

By increasing the impurity concentration of the surface layer 228, it is possible to lower the contact resistance of the surface layer 228. Since the surface layer 228 is not a layer which is formed by CVD or the like, a thickness of the surface layer 228 can be made extremely small so that a resistance valve of the surface layer 228 per se can be lowered. Further, the impurity concentration of the surface layer 228 is increased by the plasma treatment and hence, it is possible to form the structure having a concentration gradient with no interface between a high concentration layer and a low concentration layer.

It is possible to increase the impurity concentration of the surface layer 228 by annealing the semiconductor layer 218 after injecting impurities into the semiconductor layer 218. In this case, however, the annealing method is performed at a temperature of approximately 500° C. To the contrary, the plasma treatment can be performed at a low temperature (approximately 300° C. or below 300° C.). Further, in a method where the semiconductor layer 218 of high impurity concentration is formed by stacking using CVD or the like, it is necessary to use etching in forming the semiconductor layer 218 by patterning. In this embodiment, etching is unnecessary.

In this embodiment, the plasma treatment is applied to the semiconductor layer 218 which is formed by patterning and hence, the impurity concentration of the surface layer 228 is increased also on side surfaces of the semiconductor layer 218 raised from the gate insulation film 216.

Figure 15:
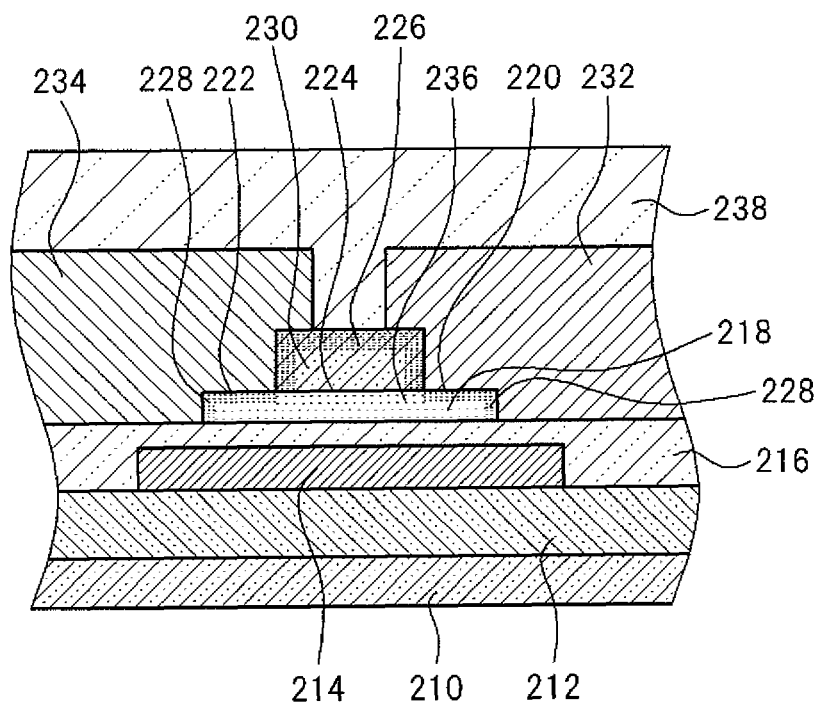
FIG. 15 is a view for explaining a method for manufacturing thin film transistors according to another embodiment of the present invention.

As shown in FIG. 15, a source electrode 232 and a drain electrode 234 made of Al, for example, are formed on the surface layers 228 of the first region 220 and the second region 222 of the semiconductor layer 218 to which the plasma treatment is applied. The surface layer 228 exhibits high impurity concentration and hence, the contact resistance between the surface layer 228 and the source electrode 232 and the contact resistance between the surface layer 228 and the drain electrode 234 are lowered. Here, to prevent the diffusion of Al which constitutes the source electrode 232 and the drain electrode 234 and to further reduce the contact resistance, a barrier metal layer (not shown in the drawing) made of high-melting-point metal such as Ti or Mo or an alloy of these metals may be formed over or below the source electrode 232 and the drain electrode 234.

Here, the source electrode 232 and the drain electrode 234 are formed such that a conductive film (not shown in the drawing) is formed so as to cover the semiconductor layer 218 and the channel protective film 226, and the conductive film is etched. Although a portion of the conductive film (not shown in the drawing) is removed on the channel protective film 226, the third region 224 of the semiconductor layer 218 which is covered with the channel protective film 226 is not influenced by etching. Further, the above-mentioned plasma treatment is applied after forming the channel protective film 226 and hence, an impurity concentration of the surface layer 236 of the third region 224 of the semiconductor layer 218 is not high. Accordingly, an etching for cutting the conduction between the first region 220 and the second region 222 is also unnecessary.

Further, a protective insulation film 238 is formed so as to cover the source electrodes 232 and the drain electrodes 234 by CVD or the like using silicon nitride or the like as a material. Thereafter, contact holes (not shown in the drawing) are formed in the protective insulation film 238, and electrodes or lines (not shown in the drawing) which are electrically connected with the source electrodes 232 and the drain electrodes 234 are formed. Other remaining processes can be performed using a known method for manufacturing thin film transistors.

According to this embodiment, the impurity concentration of the surface layer 228 of the semiconductor layer 218 is increased and hence, it is unnecessary to further form the semiconductor layer having high impurity concentration on the semiconductor layer 218, and it is also unnecessary to etch the semiconductor layer 218. Accordingly, the etching process can be simplified and, at the same time, a total thickness of the semiconductor layer 218 can be decreased. Further, it is possible to prevent the generation of a leak current attributed to light. Still further, by making the surface layer 228 thin, a resistance value of the surface layer 228 can be lowered thus enhancing an ON characteristic of a field effect transistor.

In this embodiment, each thin film transistor is formed as a switching element for controlling a pixel of the liquid crystal display panel. Accordingly, processes corresponding to the formation of the thin film transistor as the switching element are further performed.

Figure 16:
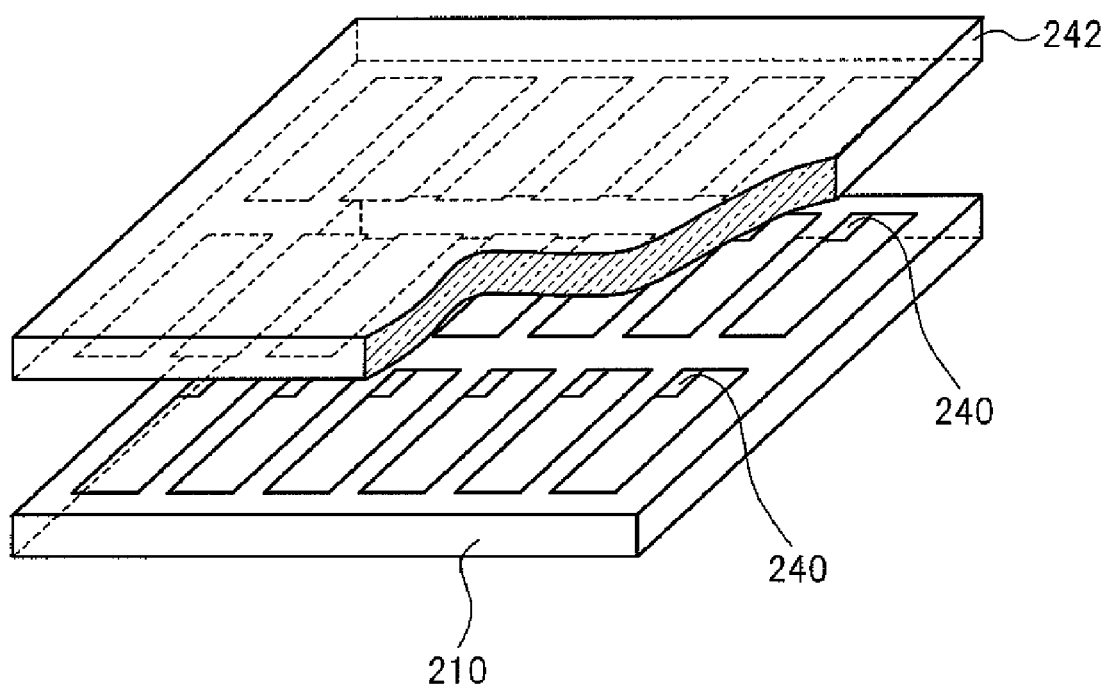
FIG. 16 is a perspective view showing the schematic constitution of a liquid crystal display panel.

FIG. 16 is a perspective view showing the schematic constitution of a liquid crystal display panel. The liquid crystal display panel includes a substrate 210 on which the above-mentioned thin film transistors 240 are formed and a color filter substrate 242, and liquid crystal not shown in the drawing is arranged between both substrates. Here, the present invention is also applicable to an organic electroluminescence display panel instead of the liquid crystal display panel. These display panels may be formed of a flexible display.

The present invention is not limited to the above-mentioned embodiments and various modifications are conceivable. For example, the constitutions explained in the above-mentioned embodiments may be replaced with the constitution which is substantially equal to the above-mentioned constitutions, the constitution by which the same manner of operation and advantageous effects as the above-mentioned constitution can be obtained, and the constitution by which the same object as the above-mentioned embodiment can be achieved.

What is claimed is:

1. A method for manufacturing thin film transistors comprising:
   forming a gate electrode;
   forming a gate insulation film so as to cover the gate electrode;
   forming a semiconductor layer, which is smaller than the gate electrode, in a region on the gate insulation film such that a projection surface of the semiconductor layer falls within a projection surface of the gate electrode;
   forming a channel protective film on a third region sandwiched between a first region and a second region of the semiconductor layer;
   increasing impurity concentration of surface layers of the first region and the second region by applying plasma treatment to the first region, the second region and the channel protective film using a gas which contains a dopant; and
   forming a source electrode and a drain electrode respectively on the surface layers of the first region and the second region to which the plasma treatment is applied.

2. The method for manufacturing thin film transistors according to claim 1, wherein the gas contains phosphine which is a phosphorus compound as the dopant.

3. The method for manufacturing thin film transistors according to claim 2, wherein a surface layer of the channel protective film is doped with phosphorus by the plasma treatment thus forming a gettering layer which captures contamination substances by a gettering effect.

4. The method for manufacturing thin film transistors according to claim 1, wherein the gate electrode has a light blocking property.

5. The method for manufacturing thin film transistors according to claim 1, wherein the channel protective film is made of silicon oxide or silicon nitride.

6. The method for manufacturing thin film transistors according to claim 1, wherein the semiconductor layer is annealed after the plasma treatment is applied, so as to further increase impurity concentrations of the surface layers of the first and second regions.

7. The method for manufacturing thin film transistors according to claim 1, wherein impurity concentrations of surface layers of side surfaces of the first and second regions are increased by applying the plasma treatment.

* * * * *